United States Patent
Malek et al.

(10) Patent No.: US 7,657,387 B2
(45) Date of Patent: Feb. 2, 2010

(54) METHOD OF PROCESSING AND STORING MASS SPECTROMETRY DATA

(75) Inventors: Robert Malek, Lilienthal (DE); Oliver Lange, Bremen (DE)

(73) Assignee: Thermo Finnigan LLC, San Jose, CA (US)

( * ) Notice: Subject to any disclaimer, the term of this patent is extended or adjusted under 35 U.S.C. 154(b) by 283 days.

(21) Appl. No.: 10/573,395

(22) PCT Filed: Sep. 23, 2004

(86) PCT No.: PCT/EP2004/010736

§ 371 (c)(1),
(2), (4) Date: Mar. 22, 2006

(87) PCT Pub. No.: WO2005/031791

PCT Pub. Date: Apr. 7, 2005

(65) Prior Publication Data

US 2007/0143319 A1    Jun. 21, 2007

(30) Foreign Application Priority Data

Sep. 25, 2003 (GB) ................................. 0322481.3

(51) Int. Cl.
*G06F 17/00* (2006.01)
(52) U.S. Cl. ............................ 702/66; 702/76; 702/182; 702/191; 250/226; 356/303; 356/319
(58) Field of Classification Search .................... 702/66, 702/191, 75–77, 179, 182, 189; 250/281–282, 250/290–291, 286, 288, 226; 708/300, 203; 356/303, 319

See application file for complete search history.

(56) References Cited

U.S. PATENT DOCUMENTS 4,008,388 A * 2/1977 McLafferty et al. ........... 702/27

(Continued)

OTHER PUBLICATIONS

Grotch, Stanley L., "Computer Identification of Mass Spectra Using Highly Compressed Spectral Codes," Analytical Chemistry, vol. 45 (No. 1), p. 2-6, (Jan. 1, 1973).

(Continued)

*Primary Examiner*—Drew A Dunn
*Assistant Examiner*—Hien X Vo
(74) *Attorney, Agent, or Firm*—Charles B. Katz

(57) ABSTRACT

A data compression technique is disclosed for Fourier Transform Mass Spectrometry (FTMS). A statistical analysis is applied to the data in the frequency domain since most of this data is a result of randomly distributed electronic noise. A fit of the whole frequency dataset to the distribution is made to determine preliminary moments of the distribution. The data in the tail of that distribution (which is mainly the peak data) is then removed and the remaining data points are re-fitted to the distribution, to identify the moments of distribution of that remaining noise data. A noise threshold for the mass spectrum is then applied using the calculated moments. The data above the threshold is kept. The whole spectrum can be reconstituted by storing the moments of distribution along with the peak data and then regenerating the noise from those moments and adding it to the peak data.

25 Claims, 6 Drawing Sheets

U.S. PATENT DOCUMENTS

| | | | |
|---|---|---|---|
| 4,875,169 | A | 10/1989 | Synovec et al. |
| 5,175,430 | A | 12/1992 | Enke et al. |
| 5,592,402 | A | 1/1997 | Beebe et al. |
| 5,774,385 | A * | 6/1998 | Bristol ................. 708/203 |
| 5,995,989 | A * | 11/1999 | Gedcke et al. ........... 708/300 |
| 6,502,045 | B1 * | 12/2002 | Biagiotti ................. 702/66 |

OTHER PUBLICATIONS

Hanna, D. Alan, "FTMS Noise Characterization," Proc. ASMS 33rd Annual Conference on Mass Spectrum and Allied Topics, p. 435-436, (May 1, 1985).

Lam, et al., "Clipped Fourier Transform Mass Spectral Compression Algorithm for Microcomputer-compatible Search Systems," Analytical Chemistry, American Chemical Society (Columbus, US), vol. 53 (No. 11), p. 1679-1684, (Sep. 1, 1981).

* cited by examiner

METHOD OF PROCESSING AND STORING MASS SPECTROMETRY DATA

FIELD OF THE INVENTION

This invention relates to a method of processing and storing mass spectrometry data, particularly though not exclusively such data obtained from Fourier Transform Ion Cyclotron Resonance Mass Spectrometry (FTMS).

BACKGROUND TO THE INVENTION

Spectrometry in general, and mass spectrometry in particular, produces extremely rich data sets. This is especially true for high-resolution mass spectrometry data such as those obtained using double focussing magnetic sector mass spectrometry, time-of-flight mass spectrometry and Fourier transform mass spectrometry. For example, an acquisition of one spectrum in the standard operation mode of an FTMS spectrometer generates one MWord (approximately 8 Mbytes) of spectral information. Typically, these spectra are stored in a computer memory or an alternative computer readable medium and a large amount of memory is required for storage. The bulk of such spectrometry data sets does not contain valuable information but instead mostly comprises noise which is of no analytical value besides its overall amplitude and standard deviation.

Currently, mass spectrometers will either store the entire data set or may try to reduce the size of the data set in one of two ways.

The first is merely to store a list of peaks found in a mass spectrum (i.e. to store the position and magnitude of each peak). This method has the disadvantage that it is impossible for a user or software to re-evaluate data for further characteristics such as peak shape, background, signal-to-noise ratio or other information that cannot be generated without additional assumptions. Information about the non-peak part of a spectrum is very valuable when information is processed further either manually or automatically. The signal-to-noise ratio gives important hints about the significance of an event. In addition, groups of peaks are very helpful to the skilled user who can evaluate spectra with far greater skill than mere automatic processing of the location and intensity of peaks within a group.

A second method of reducing the size of data file to be stored is achieved by an operator pre-selecting a threshold value and software storing only data points of a spectrum whose value is greater than this threshold. If the operator guesses the threshold value correctly, only data points belonging to peaks will be stored. This has the advantage of preserving information about peak shape. However, this method has the disadvantage that it relies upon the skill of an operator to set the threshold level correctly. If the threshold level is set too low, typically a large quantity of noise data points will be stored along with peak data points and, if the threshold is set too high, valuable information relating to peak shape will be lost as data points of the base of peaks will be missed. Accordingly, such software is difficult for anyone other than an experienced operator to use successfully. In addition, no information relating to noise is stored such that all such information is lost.

An improvement to the analysis of noise in FTMS data is described by Hanna in "Advances in Mass Spectrometry 1985: proceedings of the $10^{th}$ International Mass Spectrometry Conference", Swansea, 9-13 Sep. 1985, John Wiley and Sons, and separately in the Proceedings of the ASMS $33^{rd}$ Annual Conference on Mass Spectrometry and Allied Topics, May 26-31, 1985, San Diego, Calif., USA. The method that Hanna describes uses a statistical analysis of the noise present in an FTMS mass spectrum to obtain a threshold value that is used as a noise exclusion level for the spectrum. Peak lists are obtained from data above this threshold. Whilst the techniques described in the Hanna articles allow a better estimate of a suitable noise threshold to be achieved, they do still suffer from several drawbacks. Firstly, the techniques only result in the determination of peak locations, and the valuable information regarding both the peak shape and the spectral noise are lost. Secondly, the techniques are computationally relatively expensive, since, to obtain the parameters of the noise distribution, several iterations are necessary until these parameters stabilise.

SUMMARY OF THE INVENTION

Against this background, an embodiment of the invention provides a method of compressing mass spectrometry data. The method includes reading data corresponding to a spectrum, and conducting a statistical analysis of the noise within the data to derive one or more statistical moments or parameters characterizing noise distribution. A threshold value is calculated based on the derived statistical moment(s)/parameters(s), and peaks are identified in the spectrum by applying the threshold value to the spectrum data. Information representative of the identified peaks and statistical moment(s)/parameter(s) are stored for subsequent retrieval and processing.

According to another embodiment of the invention, a method for compressing mass spectrometric data on a block-wise basis includes steps of reading data corresponding to a spectrum and dividing the data into a plurality of data blocks. For each block, a statistical analysis is performed on the noise of the data within that block to derive one or more statistical moments or parameters, which are then used to determine a threshold value for the noise within the block. Peaks within the block are identified by applying the threshold to the spectrum data, and information representative of the identified peaks and the derived statistical moment(s)/parameter(s) associated with the block are stored.

BRIEF DESCRIPTION OF THE DRAWINGS

In order that the invention may be more readily understood, reference will now be made, by way of example only, to the accompanying drawings in which:

FIG. 5 shows a sample set of spectrometry data with calculated statistical parameters marked on;

DETAILED DESCRIPTION OF A PREFERRED EMBODIMENT

In Fourier transform ion cyclotron resonance mass spectrometer (FTMS), as is well known, ions are generated at an ion source and are injected into a measurement cell, usually from a storage device such as a linear ion trap. Application of an homogeneous magnetic field and an rf electric (excitation) field to ions held in the cell cause them to orbit at a cyclotron frequency in that cell. The ions are detected by image currents in detection electrodes in the cell.

Figure 1:
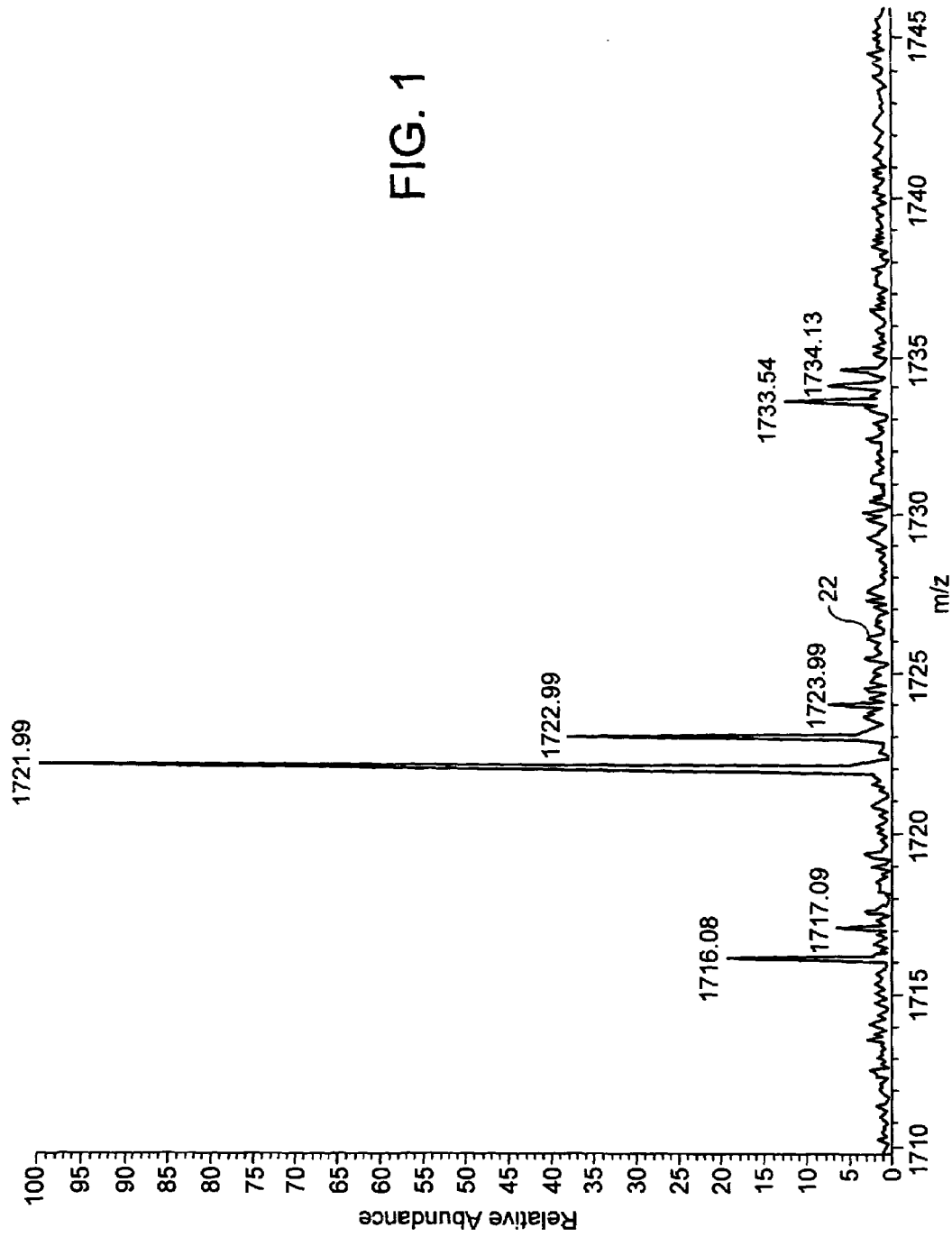
FIG. 1 shows a part of a prior art mass spectrum containing both noise and data peaks.

The raw data which is obtained by this technique is in the time domain and is known as a transient. Once the transient has been obtained, in a prior art FTMS, a mass spectrum is obtained by the following technique. Firstly, the transient is apodised and zero filled. Next, a Fourier Transform of the data into the frequency domain is carried out. This provides a complex frequency spectrum which consists of pairs of values made up of a real and an imaginary part. After that, a magnitude spectrum is obtained point by point using the expression $P=(Im^2+Re^2)^{1/2}$. This is transformed to a mass spectrum by applying a calibration equation. An example of the resulting mass spectrum is shown in FIG. 1. It will be seen that the data includes one or more peaks (labelled with the mass number in FIG. 1) and a large quantity of noise.

For a full FTMS data set, obtaining the full mass spectrum of FIG. 1 using the prior art technique above is computationally expensive not least because of the number of successive calculations that need to be carried out, in each case using all of the data points. This is particularly undesirable since a significant proportion of the mass spectrum is anyway noise which is analytically of little or no value.

A first goal of the technique embodying the present invention, therefore, is to remove the noise from the mass spectrum signal. In seeking to achieve this, it is desirable to strike a balance between overcompression of the raw data on the one hand by removing so much data that true peaks are lost as well, and removing too little of the signal such that unnecessarily large amounts of noise are left in the resulting mass spectrum. The technique employed statistically analyses the noise in the data to allow the optimal amount thereof to be removed prior to data storage.

Figure 2:
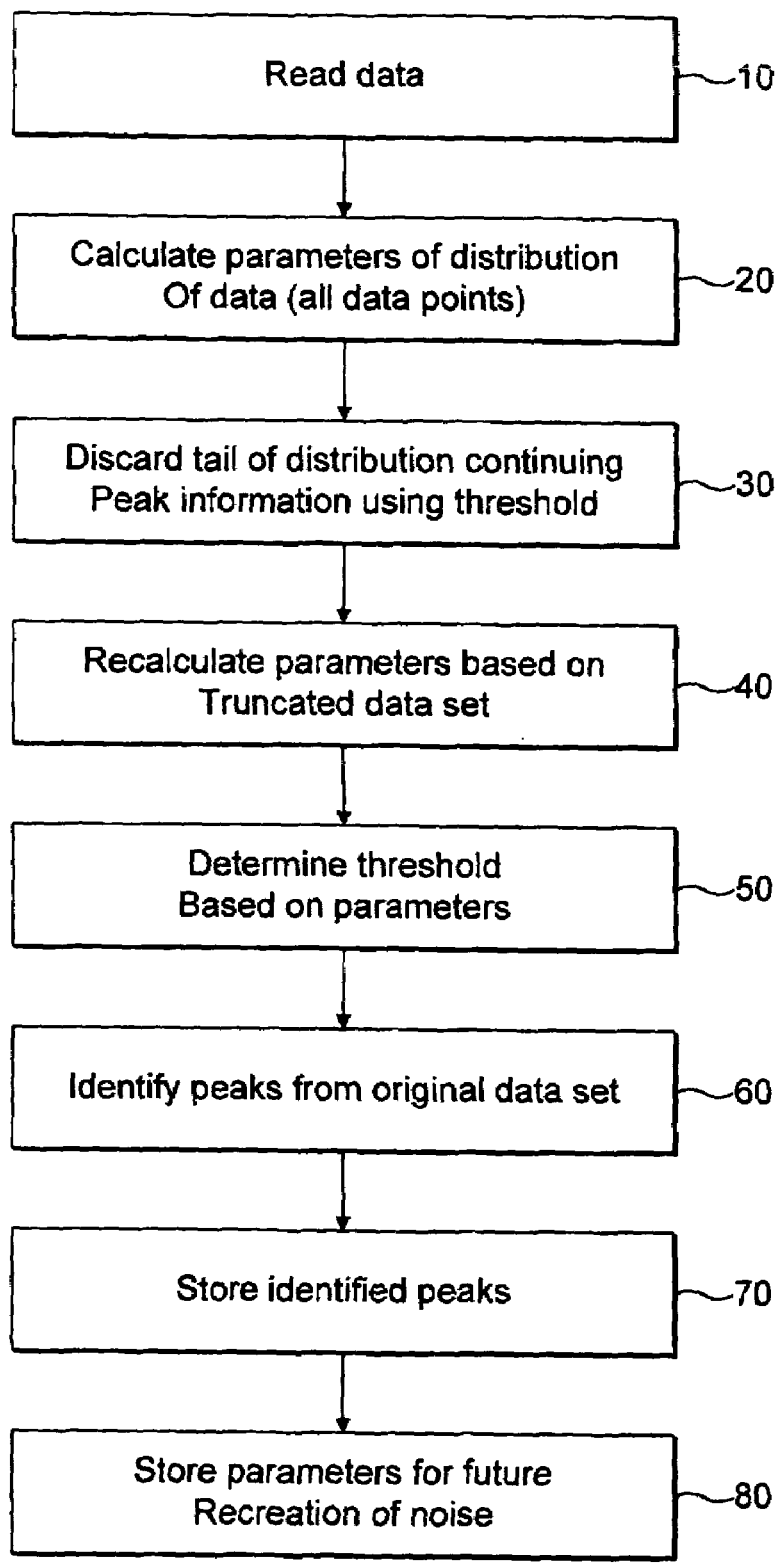
FIG. 2 shows a flow chart illustrating a data processing and compression scheme which embodies the present invention.

The procedure is best understood by reference first to the flow chart of FIG. 2 which shows an overview of the procedure for the identification and removal of noise from spectrometric data, leading to storage of peak information and, optionally, noise information as well in an optimal manner.

At step 10 of FIG. 2, FTMS data to be compressed is read by a processor. In an important preferred feature of the present invention, the data which is to be compressed is still in the form of a complex frequency spectrum, that is, it is the output of a Fourier Transform of the apodised, zero filled time domain transient (see above). Carrying out compression at this early stage in the conversion of a raw transient into a mass spectrum is desirable because it reduces the amount of remaining data points to be processed in the later stages of the conversion.

Once the (complex) frequency domain data have been read by the processor, a statistical analysis is carried out. The steps in the statistical analysis, and the reason for these, are better be understood by reference to FIG. 3 which shows, highly schematically, a histogram of all of the data points read at step 10. Each block on the horizontal axis indicates a finite range of magnitudes of the signal read by the processor (each block preferably being of equal width in arbitrary units) and the vertical axis shows the number of data points within a given block, i.e. within a given range of magnitudes.

In a "typical" histogram, perhaps 99.85% of the data points have their origin in noise. This is apparent at least qualitatively from FIG. 1. The points in the real as well as the imaginary domain turn out to be Gaussian $(0,\sigma)$ distributed in an FTMS spectrum and the noise of the final (magnitude and mass) spectrum is a Weibull (b, 2) distributed with $b=\sigma$. As a result, parameters of the noise distribution can be determined by fitting to the real data obtained.

Figure 3:
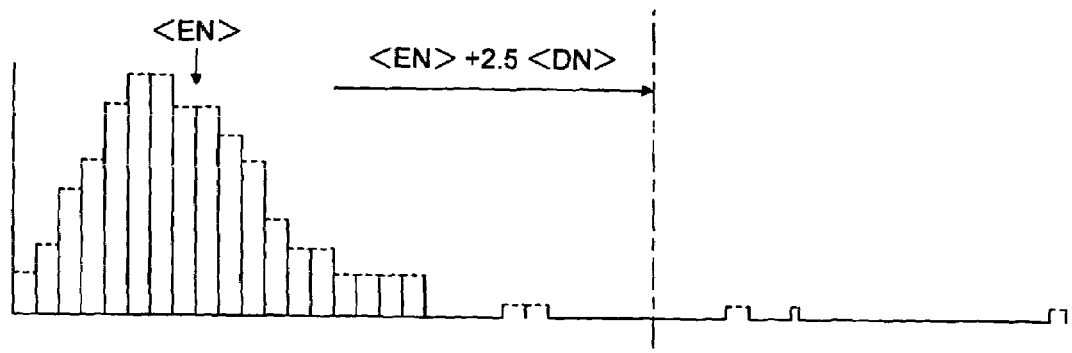
FIG. 3 shows, highly schematically, a histogram of the full range of data obtained in an FTMS (peaks and noise)

It will be seen from FIG. 3 that the histogram has a "tail" that does not fit the theoretical distribution well. These high magnitude data points are identifiable as peaks in the mass spectrum which need to be kept in the final, compressed data. For noise analysis, however, they are undesirable as they skew the calculated parameters of the distribution. In other words, the most accurate estimation of noise statistics parameters is when the data to which the theoretical distribution is being fitted is purely noise and no longer has any peak data in it.

Referring once more to FIG. 2, therefore, the first step in the statistical analysis of the noise is shown at step 20. Here, the parameters of the distribution are obtained with all of the data present (i.e. a fit to the histogram of FIG. 3 is made). The current preferred technique determines the average or expectation value EN of the distribution, and the variance DN.

At the next step, step 30, the tail of the overall distribution is discarded. The cutoff point is chosen, in this example, to be (EN+V.DN) where V is an instrument dependent parameter that is determined experimentally and in the present example has been chosen as 2.5. The cutoff point (EN+2.5 DN) is marked on FIG. 3.

It is to be understood that the parameter V may of course be different to 2.5. It will also be understood that other moments of the distribution may be employed and that the expectation value and the standard deviation (which are the first moment and the second centred moment of the distribution) are merely a design choice and that, in general, other centred or uncentred moments could be employed to characterise the distribution and thus allow selection of a threshold.

Figure 4:
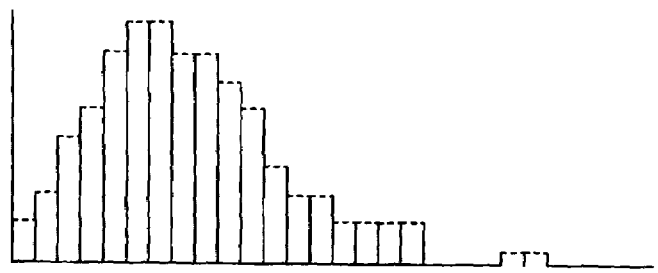
FIG. 4 shows the histogram of FIG. 3 with a threshold applied so as to remove the distribution tail.

Once the data above (EN+2.5 DN) has been discarded at step 30, a second iteration is carried out at step 40 on the remaining data. This should have most peak data removed and will accordingly look like FIG. 4, which is a highly schematic histogram of the data of FIG. 3 with points above (EN+2.5 DN) removed from it. Again, at that second iteration of step 40, moments of the distribution and in particular the revised expectation value EN' and the revised standard deviation σ' are determined from that clipped distribution. Further iterations may be carried out until EN converges but we have found that a single iteration is acceptable following initial discarding of the peak data. This is computationally desirable, and specific techniques to achieve minimal iterations will be described below in connection with FIG. 7.

Figure 5:
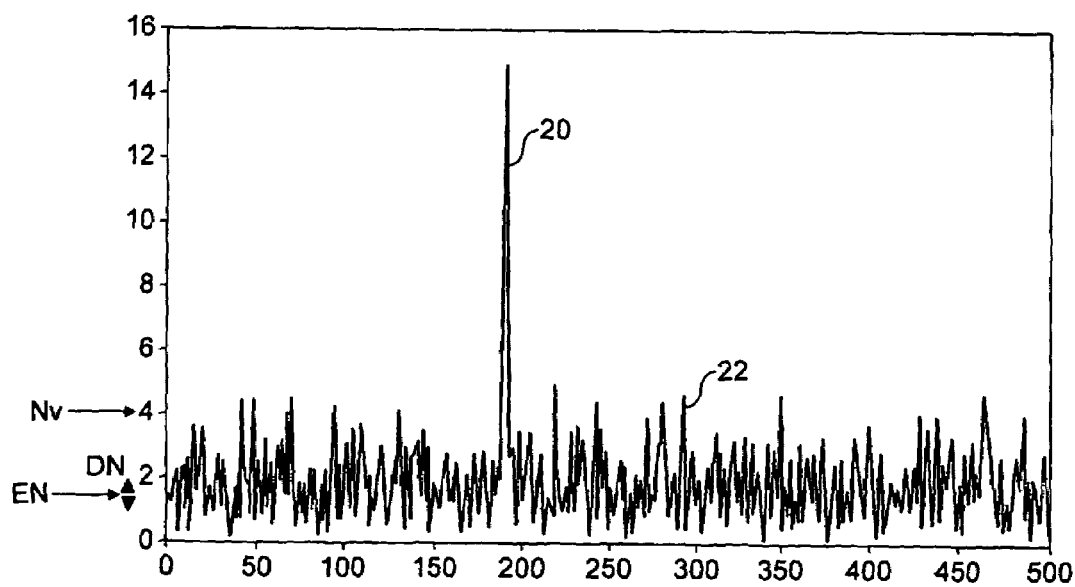

The next step in the process illustrated in FIG. 2 is to determine a threshold for the spectrometric data. This is carried out at step 50 and is based upon the parameters or moments of the distribution ascertained upon convergence. In the preferred embodiment, EN and DN as determined at step 40 are employed. In the simplest embodiment (cf the further improved technique of FIG. 7), the threshold EN+2.5 DN is then applied to all of the original data, point by point, to identify peaks in that original data set. A part of a set of mass spectrometric data is shown in FIG. 5 and the moments EN and DN are marked on to that, to illustrate physically how these moments relate to the data overall.

More particularly, at step 60, individual data points are compared against the threshold value, and peaks are identified by looking for series of three consecutive data points or more above the threshold. The first and last data points in such a series are used to define the start and end of the peak. However, the width of the peak is subject to a condition that is should be at least eight data points wide. If the beginning and end of the peak are less than eight data points wide, a window of eight data points is taken such that it is centred on the middle of the peak. Accordingly, each peak will have at least eight data points saved in the data file. It will be understood that the selection of the threshold affects the peak identification. By setting a relatively lower threshold (we have chosen EN+2.5 DN), it is possible to use the technique described above to identify peaks according to a profile "signature". Furthermore, although a higher threshold (EN+y.DN, y>2.5) would reduce the number of false positives in the peak determination, useful information regarding the actual shape of the peak would be lost.

In addition to storing the data points corresponding to the peaks at step 70, the determined value of the average, standard deviation and the parameter V for the mass spectrometer are also saved to the data file at step 80.

Figure 6:
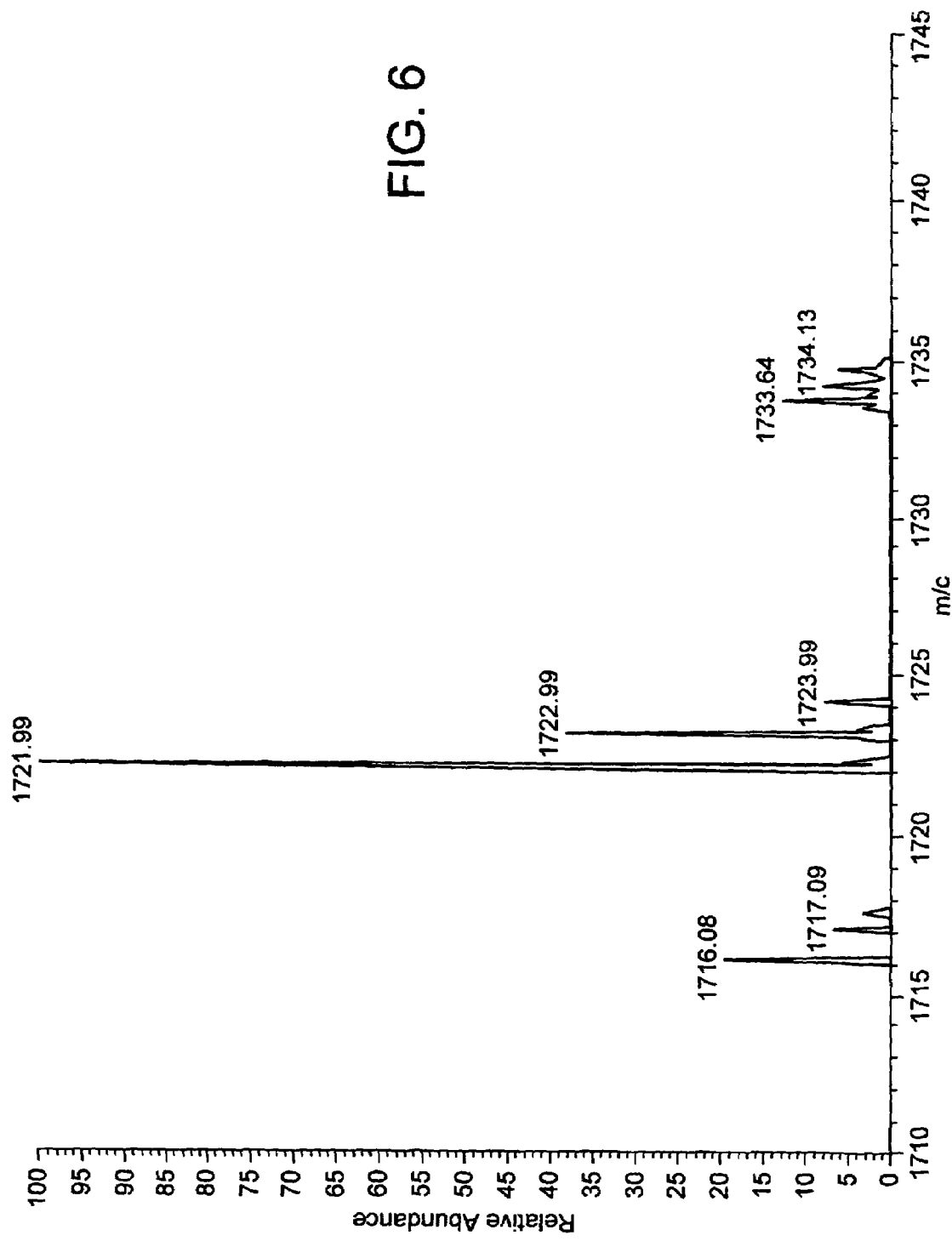
FIG. 6 shows the mass spectrum of FIG. 1 with the noise removed.

The information thus obtained can then be converted into a mass spectrum, such as the one shown in FIG. 6 which is the same as the mass spectrum of FIG. 1 but with the noise removed. Since so much of the data making up a mass spectrum is noise, the dataset thus stored is significantly compressed relative to a full dataset. Nevertheless, it will be noted that there is no modelling or estimation in the peak data, that is, the stored peak data are "true" data obtained directly from a Fourier Transform of the full transient. The peak data are therefore identical to the peak data in FIG. 1. With a data file corresponding to the mass spectrum saved, analysis is possible at remote locations and/or at times subsequent to the mass spectrometry experiment being performed.

Although it may be desirable or beneficial to display the data without the noise, there may be circumstances where it is appropriate to display the noise as well. Whilst often the noise is of little or no analytical value, stored information about the noise can, nevertheless, aid algorithms to perform tasks such as substance identification from mass spectra. Even though the data have been dramatically compressed, it is in fact possible to recreate the "full" spectrum of FIG. 1 from the stored information. This is done by using the stored statistical parameters or moments of the noise distribution, along with the known distribution, to recreate the noise. This can then be concatenated with the true peak data that is also stored in the data file, and all of this can be displayed together if desired. Because the parameters/moments obtained in the initial analysis typically have a less than 0.1% error once the peak data has been excluded, and because the peak data is identical to that which would be obtained without any compression, the resulting full mass spectrum of the present method will in turn appear, visually, essentially the same as the uncompressed spectrum, and algorithms that operate on that data will have the same results.

In addition, software may perform an averaging or adding routine taking two or more mass spectra and adding the values of the data points for equivalent m/z values, thereby improving statistics. When performing such a routine, an averaging algorithm can calculate new combined values for EN and DN (and hence the threshold value) from the individual data files and thus qualify peaks in averaged mass spectra against their total signal-to-noise ratio.

Figure 7:
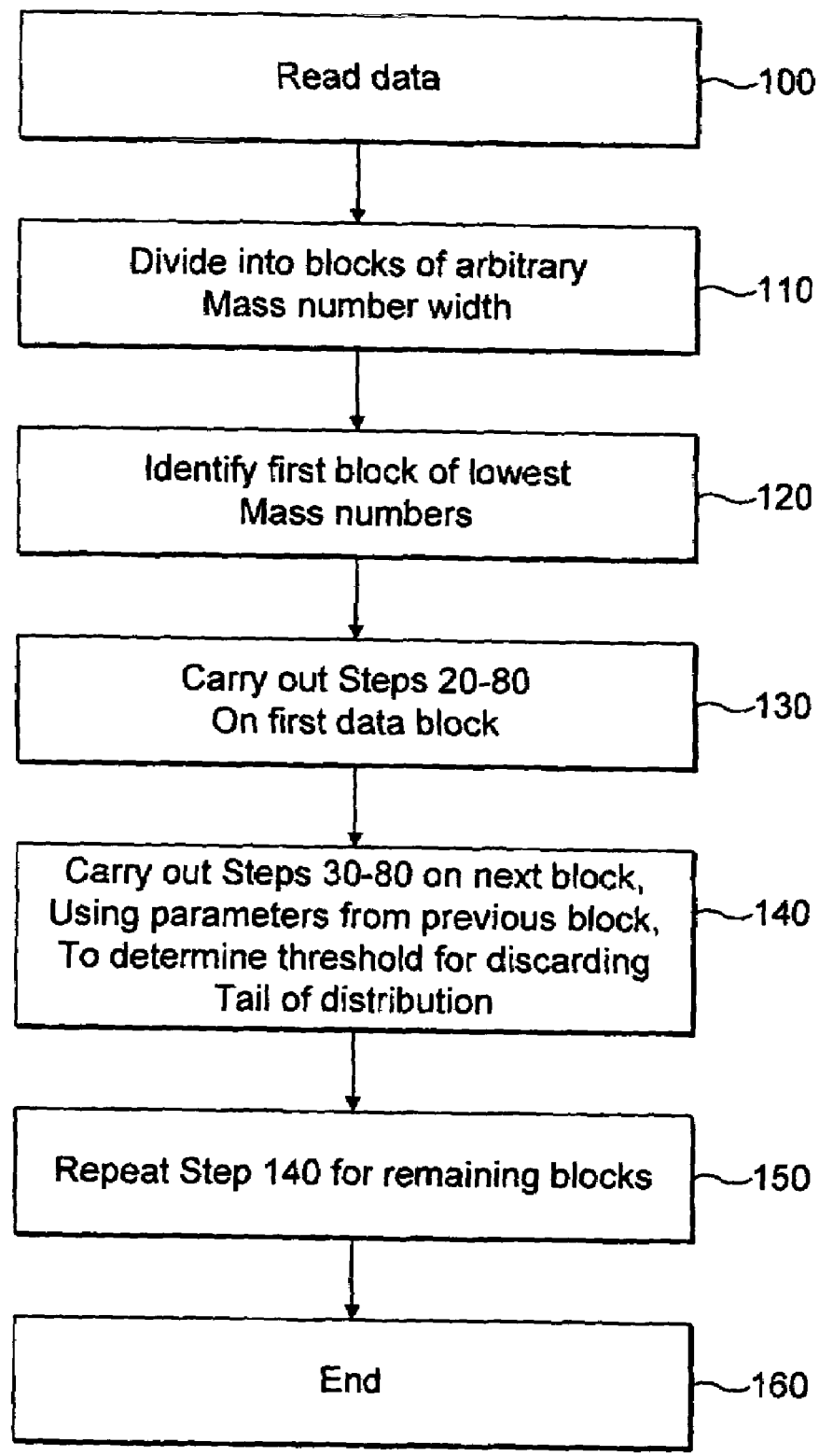
FIG. 7 shows a flow chart illustrating a further improvement to the data processing and compression scheme of FIG. 2.

Referring now to FIG. 7, a flow chart of still a further improvement to the technique of FIG. 2 is shown. The process of FIG. 7 minimises the amount of statistical analysis and iterations that need to be carried out in the procedure described above.

At step 100, as in FIG. 2, the data set is read by a processor. However, in the embodiment of FIG. 7, the data are not all processed together. Instead, the data are divided into blocks containing an arbitrary number of raw data points, for example, as shown at step 110. In preference, each block is of the same width (i.e. has the same number of data points). However, it may be desirable instead to use blocks of different width.

The next step, step 120, is to identify one of the blocks with the least amount of peaks in it, or, at least, the block in which it is expected that the least number of peaks will be found. Usually, this will be the block with the lowest mass numbers in it. The reason for choosing this block is that, the fewer peaks that there are to be discarded from the raw data, the faster and the more accurately the statistical analysis of that data can be achieved, so that the moments of the distribution can be obtained with minimal computation. Indeed, in the case where there are no peaks to be discarded, only a single iteration of the data is needed (which principle provides a further alternative embodiment using a blank precursor spectrum, see below).

As indicated at step 130 of FIG. 7, the parameters of the distribution of noise in the first chosen block are obtained exactly as for the whole distribution as described above in connection with FIG. 2. Also as described in connection with FIG. 2, the parameters are then used to obtain a threshold that is applied to all of the data points in that first block, and the statistical parameters are then stored along with the peak data in a data file for that first block.

The next block is then analysed at step 140. Instead of starting from the beginning, however, and analysing all of the data in the second block, it has been found that a significant saving in calculations can be made by starting from the assumption that the statistical moments calculated in respect of the first (i.e. the preceding) block will be not greatly dissimilar to those for the next block to be processed. This is a reasonable assumption since the noise distribution in each block (from which the parameters/moments are obtained) should be similar. Thus, the threshold $T=EN(1)+V.DN(1)$, where $EN(1)$ and $DN(1)$ are the expectation value and standard deviation for the first block respectively, is applied to all the data in the second block. This removes the tail of the distribution in the second block with a reasonable level of accuracy. Thus, a fit to the distribution in the second block does not first need to be done to all the data. The first (and usually, the only) fit that is necessary for that second block is accordingly a determination of $EN(2)$ and $DN(2)$ from the distribution which is already truncated using the moments of the distribution in the first block. This is shown at step 140 of FIG. 7.

As shown at step 150, this procedure can then be repeated at each block, using the values of EN and DN determined from the previous block in the determination of a threshold for removal of peak data prior to noise analysis. The procedure ends at step 160 when all blocks have been analysed and the data for each has been stored.

The procedure of FIG. 7 has three main benefits. Firstly, by careful selection of the first block, the amount of computation necessary in respect of a statistical analysis of the noise of that block is minimised. Secondly, the processing time required for each subsequent block is reduced by using data from the previous block in the initial selection of the data for statistical analysis. Finally, the use of blocks allows the analysis of the data to take into account the fact that the discrimination between peaks and noise is to a certain extent dependent upon the mass number, that is, the ratio of peak height to average noise height tends to be different for low mass numbers and high mass numbers. Continually recalculating the statistical moments for successive blocks of increasing or decreasing mass numbers inherently addresses this. The block division method also allows to have sections in the spectrum which consist of peaks only, carrying over the statistical information from previous blocks to the third, fourth, fifth and so on, if no non-peak data is found earlier.

Figure 8:
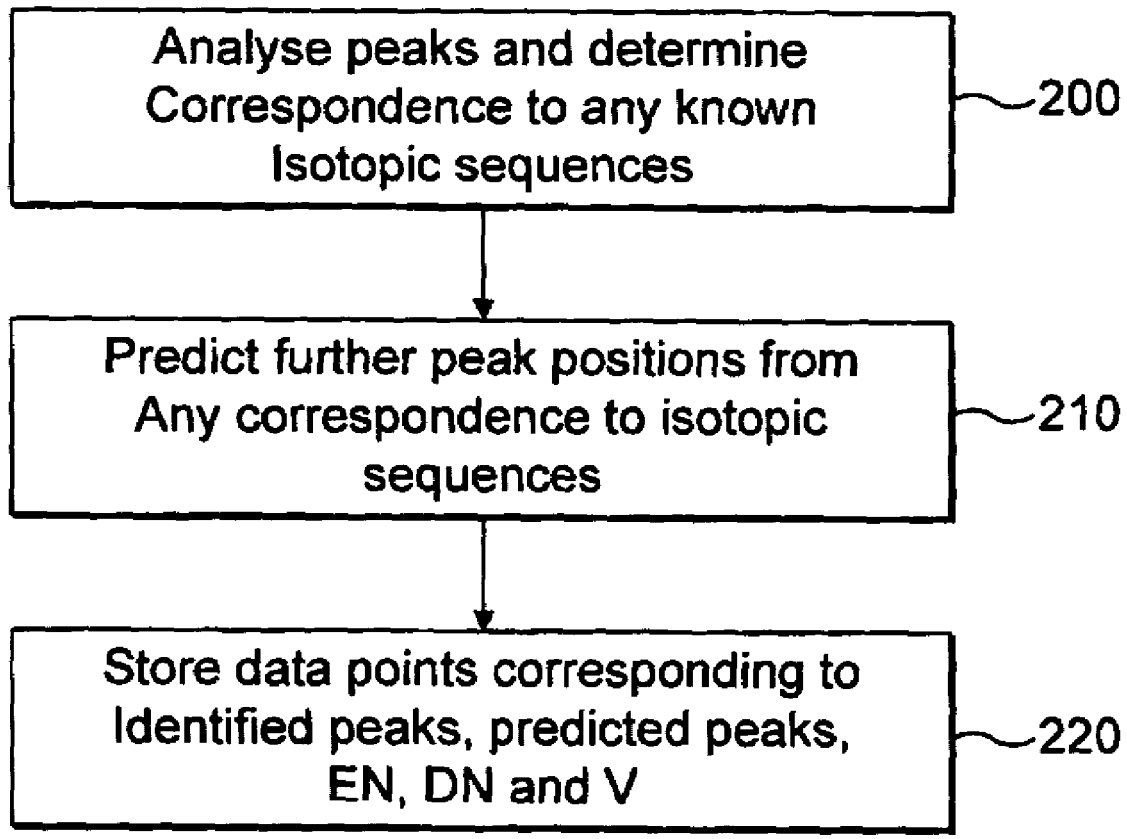
FIG. 8 shows a flow chart illustrating still a further improvement to the data processing and compression schemes of FIGS. 2 and/or 7.

FIG. 8 shows a flow chart of still a further improvement to the foregoing method, in which two further steps are carried out once the peaks have been identified at step 60 of FIG. 2 (also carried out in the process of FIG. 7), using the threshold value determined at step 50 of FIG. 2.

At step 200 of FIG. 8, the peak positions are determined by finding the value of either the central data point or by interpolating between two or more points where the peak contains an even number of centre points, and these values are passed to pattern recognition software. For example, patterns corresponding to peak multiplets in 1Da/z spacing may be looked for as these correspond to the peaks within an isotopic pattern of a molecule. These peaks will be spaced apart by one atomic mass unit. In this context Da represents the atomic mass unit and z is the charge of the molecule.

If groups of peaks are recognised at step 200, like the isotopic pattern of a molecule or element, data points within neighbouring areas that appear in the distance of the repeat scheme of the recognised group are predicted at step 210 and the corresponding data points are stored at 220 even when no significant peak was detected by comparison to the threshold value. A reasonable number of data points are stored to the left and/or right of found peaks; how many is either pre-determined or is calculated from peak information. For example, when organic material is being analysed, it is a good assumption that 12C and 13C isotopes are binomial distributed. The number of useful candidates to the left and right of the peak can then be determined from the amplitude of the found peaks and the decay rate of a binomial distribution for the number of carbon atoms that fit the mass and charge of the ions that generate the isotopic pattern. The charge can be calculated from the separation of the isotopic peaks, e.g. for a charge of 2, the peaks will be ½ a mass apart.

With the positions of further peaks predicted at 210, the data points corresponding to these positions are saved to the data file at 220 in addition to the data points corresponding to identified peaks and the values of EN, DN and V.

An example of an isotopic sequence can be seen in FIGS. 1 and 6. The three peaks at m/z ratios of 1722, 1723 and 1724 form an isotopic sequence with decreasing intensities. There may be a further peak at 1725 but this may be swamped by the noise level such that it is not observable due to a poor signal-to-noise ratio. However, it may well be valuable to save the data points around the 1725 m/z position such that it is available for later analysis. For example, one or more other data files corresponding to mass spectra taken from the same sample may be added together such that the signal-to-noise ratio will improve and a peak at 1725 may become apparent.

The embodiment of FIG. 8 describes a method of predicting peaks belonging to isotopic sequences. An alternative prediction routine may be used to predict the peaks belonging to ion fragments derived from larger parent molecules, e.g. large organic parent molecules giving rise to peaks relating to smaller fragment ions.

The skilled person will appreciate that variations may be made to the above embodiments without departing from the scope of the present invention. For example, the above embodiments have been described in the context of mass spectroscopy but the present invention enjoys application in many other types of spectroscopy. Specifically, it is to be understood that the foregoing description of a preferred embodiment relates to FTMS but that this is merely by way of an example and that the invention is in no way so restricted. As will be appreciated, the present invention will be useful for saving data from any spectra that comprises a number of peaks separated by regions of noise. We have however found that different types of spectrometry produces spectra having different noise distributions. For example, Time of Flight (TOF) Mass Spectrometry appears to produce a Poisson distributed noise spectrum. Nevertheless, the foregoing principles still apply equally.

If it is not known, a priori, what distribution the noise data fits for a given technique, this can be ascertained by carrying out an analysis for example on a blank spectrum which only contains noise.

Indeed, the use of a blank spectrum is a useful alternative approach to the determination of statistical parameters of the noise distribution, since in that case no removal of peak data is first necessary. The parameters obtained from the distribution of noise in the blank spectrum can be used as a starting point for subsequent calculations on either all the data, or the first block when the data are so divided.

Whilst carrying out the statistical analysis to remove the noise is best done as early as possible to minimise subsequent calculations, it should be understood that there are nevertheless benefits to be gained by use of the method now described, even if it is carried out later on in the conversion procedure, primarily in terms of the size of the data sets that are generated relative to the prior art. This is particularly true because the full data sets can in fact be reproduced to a very high accuracy from the peak data and statistical moments that are stored.

Finally, whilst the specific embodiment describes the calculation and saving of data peaks plus certain statistical parameters, in particular the expectation value and standard deviation of the noise distribution, to data files, it is to be understood that other information can also be saved. For example, the calculated central mass and intensity of identified peaks may be saved along with certain flags. Examples of flags include special characteristics of the peak like close proximity to another peak in the event of merging peaks, an unexpected peak width where the peak width in FTMS data will be constant within the spectrum, the mass resolution of any peak and any other background information. Obviously any combination of this information can be saved either in addition or as an alternative to the data points, EN, DN and V saved in the embodiments described above.

What is claimed is:

1. A method of performing mass spectrometric analysis, comprising the steps of:
   (a) mass analyzing ions in a mass spectrometer to generate data corresponding to a spectrum, and reading the data in a processor;
   (b) carrying out a statistical analysis of noise within the read data to obtain at least one statistical moment or parameter related to the distribution of the noise;
   (c) determining a threshold value from the at least one obtained statistical moment or parameter;
   (d) identifying peaks in the spectrum by comparison of the data points in the spectrum to the threshold value; and
   (e) storing information related to the identified peaks along with the at least one obtained statistical moment or parameters.

2. The method of claim 1, wherein the step of storing the information related to the identified peak comprises storing the data points of the peaks and discarding the noise data.

3. The method of claim 1, further comprising generating a mass spectrum subsequent to the step (e) of storage.

4. The method of claim 3, further comprising displaying the mass spectrum.

5. The method of claim 4, wherein the step of displaying comprises displaying only the identified peaks without also displaying the noise in the read data.

6. The method of claim 3, further comprising, after the step of storage, reconstructing the noise data based upon one or more of the stored statistical moments or parameters.

7. The method of claim 6, wherein the step of generating the mass spectrum comprises generating a mass spectrum which includes both peak data and noise data, by combining the stored peak data with the reconstructed noise data.

8. The method of claim 1, wherein the at least one statistical moment or parameter is selected from the list comprising an expectation value, a standard deviation, and a variance.

9. The method of claim 8, wherein the threshold is EN+x*DN, where EN is the expectation value and DN is the standard deviation, and wherein x is a multiplication factor.

10. The method of claim 9, wherein x is about 2.5.

11. The method of claim 1, wherein the mass spectral data is FTMS data, wherein the noise in the read data is Weibull-distributed, and wherein step (b) of statistically analysing comprises identifying at least one statistical moment of the read data which best fits that Weibull distribution.

12. The method of claim 1, wherein the mass spectrometric data is time of flight mass spectrometer (TOF MS) data, wherein the noise in the read data is Poisson-distributed, and wherein the step (b) of statistical analysis comprises identifying at least one statistical moment of the read data which best fits that Poisson distribution.

13. The method of claim 1, wherein the step (b) of carrying out a statistical analysis of the noise comprises:
(f) obtaining a best fit of the read data to a predetermined distribution;
(g) determining, from that best fit, at least one preliminary statistical moment;
(h) generating a preliminary threshold based on the at least one preliminary statistical moment;
(j) removing from the read data, all data points above that preliminary threshold; and
(k) re-calculating a best fit of that truncated read data to a predetermined distribution so as to obtain the said at least one statistical moment or parameter related to that noise in step (b).

14. The method of claim 13, further comprising:
recursively repeating the step (j) of removing read data above a previously determined threshold, and recursively repeating the step (f) of obtaining a best fit, this time of the further truncated data to a predetermined distribution, so as to cause convergence of the at least one statistical moment.

15. A method according to claim 1, further comprising the step of determining the position of magnitude of the centre of any identified peaks, and wherein step (e) comprises storing any centre positions and magnitudes.

16. A method according to claim 1, wherein step (d) comprises identifying peaks by recognising strings of three or more consecutive data points greater than the threshold.

17. A method according to claim 1, further comprising the steps of determining the positions of two or more identified peaks, comparing the positions to determine whether they are part of any predetermined isotopic sequence and, if they are, storing data points at positions corresponding to other expected peaks within the isotopic sequence.

18. A method according to claim 1, further comprising the steps of determining the position of any unidentified peaks, comparing any peaks to determine any matches to predetermined parent/fragment molecular masses and, if any matches are found, storing data points corresponding to other expected peaks within the parent/fragment group.

19. A method of performing mass spectrometric analysis, comprising the steps of:
(a) mass analyzing ions in a mass spectrometer to generate data corresponding to a spectrum, and reading data in a processor;
(b) dividing the received data into at least two blocks;
(c) carrying out a statistical analysis on a first of the at least two blocks, of noise within read data within that block, to obtain at least one statistical moment or parameter relating to the distribution of the noise in that block;
(d) determining a threshold value from the at least one statistical moment or parameters obtained in respect of the noise within that block;
(e) identifying peaks in that block of the spectrum, by comparison of the data points in that block of the spectrum to the threshold value determined for that block; and
(f) storing information related to the identified peaks in that block, along with the obtained at least one statistical moment or parameter for that block.

20. The method of claim 19, further comprising repeating steps (c) to (f) for at least one further block.

21. The method of claim 20, further comprising identifying, from the plurality of blocks, a preferred block upon which the steps (c) to (e), or (c) to (f), are first to be carried out.

22. The method of claim 21, wherein the step of identifying a preferred block is based upon the relative likelihood of data in a particular block having a small number of peaks in it.

23. The method of claim 19, wherein the step (c) comprises:
obtaining a best fit of the read data for that block to a predetermined distribution;
determining, from that best fit, at least one preliminary statistical moment for that block;
generating a preliminary threshold, based on the at least one preliminary statistical moment for that block;
removing, from the read data for that block, all data points above that preliminary threshold; and
re-calculating a best fit of that truncated read data to a predetermined distribution, for that block, so as to obtain the at least one statistical moment or parameter related to that noise in step (c) for that block.

24. The method of claim 23, further comprising recursively repeating the step of removing data above a previously determined threshold for a particular block, and best fitting the further truncated data to a predetermined distribution, so as to cause convergence of the at least one statistical moment for that block.

25. The method of claim 23 further comprising repeating steps (c) to (f) for a next block, and wherein the step (c) further comprises, for that next block, removing, from the read data for that next block, all data points above the threshold determined for the previous block; and
re-calculating a best fit of the truncated read data in that next block to a predetermined distribution, so as to obtain a further statistical moment or moments for that next block.

* * * * *